United States Patent [19]
Tamura et al.

[11] Patent Number: 6,036,910
[45] Date of Patent: Mar. 14, 2000

[54] THREE-DIMENSIONAL OBJECT BY OPTICAL STEREOGRAPHY AND RESIN COMPOSITION CONTAINING COLORANT FOR PRODUCING THE SAME

[75] Inventors: Yorikazu Tamura; Tsuneo Hagiwara, both of Kawasaki, Japan

[73] Assignee: Teijin Seiki Co., Ltd., Osaka, Japan

[21] Appl. No.: 08/935,987

[22] Filed: Sep. 23, 1997

[30] Foreign Application Priority Data

Sep. 25, 1996 [JP] Japan ................................ 8-272929

[51] Int. Cl.7 ................ G03C 5/16; G03C 9/08; C08F 2/46; C08K 3/04
[52] U.S. Cl. .................. 264/401; 430/269; 522/71; 522/96; 522/170
[58] Field of Search ................. 522/71, 75, 81, 522/83, 96, 170; 430/269; 264/401

[56] References Cited

U.S. PATENT DOCUMENTS

| | | | |
|---|---|---|---|
| 4,164,423 | 8/1979 | Schumacher et al. | 522/81 |
| 5,014,207 | 5/1991 | Lawton . | |
| 5,059,266 | 10/1991 | Yamane et al. | 156/64 |
| 5,137,800 | 8/1992 | Neckers et al. | 430/281 |
| 5,236,812 | 8/1993 | Vassiliou et al. | 430/327 |
| 5,495,029 | 2/1996 | Steinmann et al. | 549/545 |
| 5,514,519 | 5/1996 | Neckers | 430/269 |
| 5,545,367 | 8/1996 | Bae et al. | 264/401 |

FOREIGN PATENT DOCUMENTS

| | | |
|---|---|---|
| 0 465 039 | 1/1992 | European Pat. Off. ........ 522/71 |
| 56-144478 | 11/1981 | Japan . |
| 60-247515 | 12/1985 | Japan . |
| 62-35966 | 2/1987 | Japan . |
| 1-204915 | 8/1989 | Japan . |
| 1-213304 | 8/1989 | Japan . |
| 2-28261 | 1/1990 | Japan . |
| 2-36925 | 2/1990 | Japan . |
| 2-80422 | 3/1990 | Japan . |
| 2-80423 | 3/1990 | Japan . |
| 2-113925 | 4/1990 | Japan . |
| 2-145616 | 6/1990 | Japan . |
| 2-153722 | 6/1990 | Japan . |
| 2-208305 | 8/1990 | Japan . |
| 3-21432 | 1/1991 | Japan . |
| 3-41126 | 2/1991 | Japan . |
| 3-201364 | 9/1991 | Japan . |
| 5-5004 | 1/1993 | Japan . |
| 5-279436 | 10/1993 | Japan . |
| 6-19962 | 1/1994 | Japan . |
| 6-228271 | 8/1994 | Japan . |
| 6-228413 | 8/1994 | Japan . |
| 8-146790 | 6/1996 | Japan . |

OTHER PUBLICATIONS

Brautigam, R.J. et al, Radtech '90 Conference Papers, Radtech Int'l. Chicago, "New Vinyl Ether Oligomers . . . ", pp. 99–110, 1990.

*Primary Examiner*—Susan W. Berman
*Attorney, Agent, or Firm*—Eugene Lieberstein; Michael N. Meller

[57] ABSTRACT

A resin composition for three-dimensional object by optical stereolithography containing a colorant, such as carbon black, in an amount of 0.05 to 0.5% by weight can provide a colored three-dimensional object which has excellent physical and mechanical properties such as dimensional accuracy, shape stability, hardness and tensile strength and elastic modulus in tension, as well as light-shielding properties, gives a massive impression and is colorful at a high optical shaping speed and in a good productivity.

3 Claims, No Drawings

THREE-DIMENSIONAL OBJECT BY OPTICAL STEREOGRAPHY AND RESIN COMPOSITION CONTAINING COLORANT FOR PRODUCING THE SAME

DETAILED DESCRIPTION OF THE INVENTION

This invention relates to a resin composition for three-dimensional object by optical stereolithography, a method of producing a three-dimensional object using the same, and a three-dimensional object obtained from the same. More specifically, it relates to a resin composition for producing a colored three-dimensional object which has excellent dimensional accuracy and shape stability and physical and mechanical properties typified by hardness, tensile strength and elastic modulus in tension as well as light-shielding properties, gives a massive impression and is colorful at a high optical shaping speed and in a good productivity; to a method of optically producing a colored three-dimensional object using the same, and to a colored three-dimensional object obtained from the same.

As for optical stereolithography technology, JP-A 56-144478 (the term "JP-A" as used herein means an "unexamined published Japanese patent application") discloses a so-called optical stereolithography for producing a three-dimensional object, which comprises the steps of supplying a required amount of controlled optical energy to a liquid photo-curable resin so as to cure it into a thin layer, further supplying a liquid photo-curable resin on the top of the cured layer, irradiating the resin with light under control to cure it into a thin layer to be laminated on the cured layer, and repeating this procedure to produce a three-dimensional object in the end. A basic practical application method thereof was proposed by JP-A 60-247515, and since then, a large number of other proposals on the optical stereolithography technologies have been made by JP-A 62-35966, 1-204915, 1-213304, 2-28261, 2-80422, 2-80423, 2-113925, 2-145616, 2-208305, 2-153722, 3-21432, 3-41126, 3-201364, 5-5004, 5-279436, 6-19962, 6-228413 and 6-228271.

As a typical method of optically producing a three-dimensional object is generally employed a method comprising the steps of irradiating a liquid surface of a liquid photo-curable resin composition kept in a container with ultraviolet laser beams selectively under the control of a computer so as to obtain a desired pattern to cure it to a predetermined thickness, supplying the liquid photo-curable resin composition in an amount enough to form one layer thereof to the top of the cured layer, irradiating it with ultraviolet laser beams likewise to cure the resin so as to form a continuous and integral cured layer, and repeating this lamination procedure until a three-dimensional object having a final shape is obtained. In this case, even if the shape of the model is too complex, a desired three-dimensional object can be produced easily in a relatively short period of time. Therefore, this method has been attracting much attention in recent years.

In recent years, three-dimensional objects obtained by the optical stereolithography have been developed from concept models to practical applications such as test models, prototypes or the like. Along with this development, the three-dimensional objects have been required to have high dimensional accuracy, excellent shape stability and excellent mechanical properties. In addition, along with development of application and expansion of demand for three-dimensional objects by optical stereolithography, colored three-dimensional objects by optical stereolithography, which give a massive impression and are colorful and also have the above excellent properties or, depending on an application, colored three-dimensional objects by optical stereolithography having light-shielding properties are now in great demand.

On the other hand, as for synthetic resin molded products obtained by an ordinary molding method such as injection molding or extrusion molding, it is widely adopted to add a pigment or pigments to synthetic resins for the purpose of coloring molded products or improving mechanical strength of molded products. In this case, a pigment is generally added in an amount of several percents to several tens percents, based on the weight of a synthetic resin.

Accordingly, to obtain a colored three-dimensional object which gives a massive impression and is colorful or a three-dimensional object which has light-shielding properties, it is conceivable that optical stereolithography is carried out after or while adding a pigment to a photo-curable resin composition like the above-described ordinary synthetic resin moldings.

However, as described above, the production of a three-dimensional object by optical stereolithography is generally carried out by irradiating the liquid surface of a liquid photo-curable resin composition with ultraviolet laser beams selectively under the control of a computer so as to obtain a desired pattern to cure it to a predetermined thickness, supplying the liquid resin composition in an amount enough to form one layer thereof to the top of the cured layer, irradiating the resin with ultraviolet laser beams likewise to cure the resin so as to form a continuous cured layer, and repeating this lamination operation. Therefore, it has been generally considered that if optical shaping is carried out after adding a pigment to a photo-curable resin composition, so that the pigment would absorb optical energy, the curing of the resin would be prevented and the curing speed would be reduced, thereby making it difficult to produce a three-dimensional object or taking a long time to produce a three-dimensional object with the result of a reduction in productivity.

Furthermore, it has been generally considered that insufficient photo-curing would be caused by the addition of the pigment and as a result, there would occur deterioration in dimensional accuracy, shape stability, mechanical properties and physical properties. Therefore, although colored three-dimensional object by optical stereolithography have been in great demand, optical shaping upon adding a pigment to a photo-curable resin composition has not been implemented so far and conventional three-dimensional objects by optical stereolithography are transparent or translucent products containing no pigment, have poor light-shielding properties and do not give a massive impression and are not colorful.

It is therefore an object of the present invention to provide a resin composition for a colored three-dimensional object by optical stereolithography.

It is another object of the present invention to provide a resin composition for producing at a high shaping speed and in a good productivity a colored three-dimensional object by optical stereolithography, which has high dimensional accuracy and good dimensional stability, excellent mechanical and physical properties such as hardness, tensile strength and elastic modulus in tension as well as light-shielding properties, gives a massive impression and is colorful.

It is a further object of the present invention to provide an optical stereolithography which is capable of producing a colored three-dimensional object having the above excellent properties at a high shaping speed and in a good productivity.

It is still another object of the present invention to provide a colored three-dimensional object produced as described above.

Other objects and advantages of the present invention are obvious from the following description.

According to the present invention, firstly, the above objects and advantages of the present invention are achieved by a resin composition for three-dimensional object by optical stereolithography, which comprises a photopolymerizable compound, a photopolymerization initiator and a colorant, the photopolymerization initiator being contained in an amount of 0.1 to 10% by weight, the colorant in an amount of 0.05 to 0.5% by weight and the photopolymerizable compound in an amount of the balance, based on the total weight of these components, and which is liquid at normal temperature.

That is, the inventors of the present invention have conducted studies to attain the above objects and as a result, have found the following fact. Namely, when a colorant (pigment in particular) which has been heretofore considered to deteriorate the physical properties of a three-dimensional object by optical stereolithography or to decrease optical shaping speed by impeding the photo-curing of a resin composition for three-dimensional object by optical stereolithography due to the absorption of optical energy when it is incorporated into the composition, is added in a specific amount much smaller than the amount used in a conventional ordinary molding method which is not an optical shaping method, to prepare a resin composition for three-dimensional object by optical stereolithography, and optical stereolithography is carried out using it, a colored three-dimensional object by optical stereolithography, which has excellent mechanical and physical properties such as dimensional accuracy, shape stability, tensile strength and elastic modulus in tension as well as light-shielding properties, gives a massive impression and is colorful can be produced at an optical shaping speed as high as that of conventional optical shaping without impeding the photo-curing of the resin and in a good productivity. Thus, the resin composition for three-dimensional object by optical stereolithography of the present invention has been achieved by this finding.

In the ordinary synthetic resin moldings produced by a general molding method such as injection molding or extrusion molding, when a pigment for coloring is added in an extremely small amount of 0.05 to 0.5% by weight, desired colored moldings cannot be obtained smoothly in many cases. Hence, the Figment is generally added in an amount of several percents to several tens of percents as described above. Therefore, it was quite unexpected that by containing a colorant in an extremely small amount of 0.05 to 0.5% by weight in the present invention, there was obtained a well-colored three-dimensional object by optical stereolithography which gave a massive impression, was colorful and had excellent light-shielding properties without impairing excellent mechanical and physical properties such as dimensional accuracy, shape stability, tensile strength and elastic modulus in tension of the three-dimensional object by optical stereolithography, while maintaining a high optical shaping speed.

The resin composition for three-dimensional object by optical stereolithography of the present invention comprises an photopolymerizable compound, an photopolymerization initiator and a colorant.

Any photopolymerizable compounds which have been conventionally used in this technical field may be used as the photopolymerizable compound. Illustrative examples of the photopolymerizable compound include acrylate compounds, epoxy acrylate compounds, urethane acrylate compounds, epoxy compounds and vinyl ether compounds. These compounds may be used alone or in combination of two or more.

As the photopolymerization initiator, a photo-radical initiator, a photo-cationic polymerization initiator or a combination thereof, for example, may be used. A suitable one is selected from these photopolymerization initiators according to the kind of the photopolymerizable compound.

Preferred examples of the photopolymerizable compound used in the present invention are as follows.

(1) Examples of the acrylate compounds are mixtures comprising monofunctional or polyfunctional polyester (meth)acrylates or polyether (meth)acrylate as an essential component and a monofunctional (meth)acrylate monomer or a polyfunctional (meth)acrylate monomer as required. In this case, a photo-radical polymerization initiator is preferably used as the photopolymerization initiator.

(2) Examples of the epoxy acrylate compounds are mixtures comprising a monofunctional or polyfunctional epoxy (meth)acrylate as an essential component and a monofunctional (meth)acrylate monomer or a polyfunctional (meth)acrylate monomer as required. In this case, a photo-radical polymerization initiator is preferably used.

(3) Examples of the urethane acrylate compounds are mixtures comprising a monofunctional or polyfunctional urethane (meth)acrylate as an essential component and a monofunctional (meth)acrylate monomer or a polyfunctional (meth)acrylate monomer as required. In this case, a photo-radical polymerization initiator is preferably used.

(4) Examples of the epoxy compounds are mixtures comprising at least one member selected from aliphatic diepoxy compounds, alicyclic diepoxy compounds and aromatic diepoxy compounds as an essential component and a monofunctional (meth)acrylate monomer or a polyfunctional (meth)acrylate monomer as required. In this case, a photo-cationic polymerization initiator is preferably used.

(5) Examples of the vinyl ether compounds are aliphatic divinyl ether compounds, alicyclic divinyl ether compounds and aromatic divinyl ether compounds. In this case, a photo-radical polymerization initiator is preferably used.

(6) Examples of mixtures of different compounds are mixtures comprising at least two members selected from the group consisting of acrylate compounds, urethane acrylate compounds and epoxy acrylate compounds. In this case, a photo-radical polymerization initiator and, as required, a photo-cationic polymerization initiator are preferably used.

The compounds (1) to (3) and (6) are described in extremely many publications and any one of these can be used in the present invention. The above epoxy compound (4) is described in JP-A 2-28261, for example, and some of the vinyl ether compounds (5) are disclosed in JP-A 2-36925, R. J. Brautigam, S. C. L. appln, and J. R. Snyder (1990) Radtech '90 Conf. Papers, Radtech Intl., Chicago, but, it is needless to say that the present invention is not limited to these compounds.

The disclosures of JP-A 2-28261, JP-A 2-36925 and Radtech '90 Conf. Papers, Radtech Intl., Chicago are herein incorporated by Referential.

In the present invention, mixtures comprising an urethane acrylate compound (3), an epoxy compound (4) or a mixture containing an urethane acrylate compound out of the above mixtures (6) are preferably used as the photopolymerizable compound.

Further, the following compound proposed by the present inventors in JP-A 8-146790 can be also used as an urethane acrylate compound (3).

That is, the compound is a mixture comprising at least one compound selected from the group consisting of urethane acrylate compounds represented by the following formula (I):

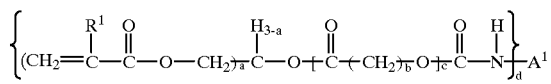

wherein $R^1$ is a hydrogen atom or a methyl group, a is 1 or 2; $A^1$ is a divalent or trivalent unsubstituted or substituted hydrocarbon group; b is an integer of 3 to 6; c is an integer of 3 to 14; and d is 2 or 3; provided that when a is 2, at least one $R^1$ is a methyl group, urethane acrylate compounds represented by the following formula (II):

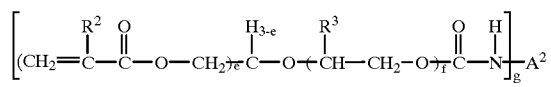

wherein $R^2$ and $R^3$ are independently a hydrogen atom or a methyl group; e is 1 or 2; $A^2$ is a divalent or trivalent unsubstituted or substituted hydrocarbon group, f is an integer of 4 to 20; and g is 2 or 3; provided that when e is 2, at least one $R^2$ is a methyl group,
and urethane acrylate compounds represented by the following formula (III):

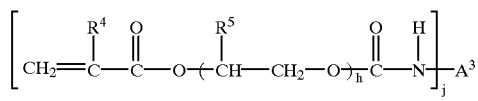

wherein $R^4$ and $R^5$ are independently a hydrogen atom or a methyl group; $A^3$ is a divalent or trivalent unsubstituted or substituted hydrocarbon group; h is an integer of 4 to 20; and j is 2 or 3,
and a radical polymerizable compound other than these urethane acrylate compounds. In this case, the weight ratio of the former urethane acrylate compound to the latter radical polymerizable compound is advantageously 80:20 to 10:90.

In the present invention, any organic and/or inorganic dyes and pigments which can color a three-dimensional object by optical stereolithography can be used as the colorant. They may be used alone or in combination of two or more as the colorant.

Inorganic pigments, particularly white, black or other colored inorganic pigments are preferably used as the colorant. Inorganic pigments usable in the present invention include carbon black; lead pigments such as white lead and red lead: titanium pigments such as titanium white and titanium black; cobalt pigments such as cobalt blue, cobalt green, cerulean blue and cobalt violet; iron pigments such as loess, red iron oxide, Prussian blue and sienna; chromium pigments such as chromium oxide, chrome yellow and viridian; manganese pigments such as mineral violet; copper pigments such as emerald green; vanadium pigments such as vanadium yellow and vanadium blue; sulfide pigments such as cadmium yellow and ultramarine; selenium compound pigments such as cadmium red; and the like.

The colorant may be dissolved or not dissolved in an photopolymerizable compound. If one of the above-described inorganic pigments which are not dissolved in a photopolymerizable compound is used as the colorant. the average particle diameter of the pigment is preferably not more than 10 μm, more preferably not more than 1 μm, from the viewpoints of uniform dispersibility and color development.

In the present invention, carbon black is particularly preferably used as the colorant. The carbon black preferably has an average particle diameter of 200 to 1,000 Å and a pH of 7 to 8. When the carbon black is used, a three-dimensional object by optical stereolithography which gives a massive impression and has light-shielding properties can be obtained. The resin composition for three-dimensional object by optical stereolithography of the present invention which contains carbon black can be effectively used for optically shaping bodies for optical products such as cameras, microscopes, binoculars, telescopes and other optical measuring instruments, other parts and prototypes.

When the carbon black has an average particle diameter of not more than 200 Å, it well develops colors advantageously but is of great bulk, thereby making it difficult to handle it. When the carbon black has an average particle diameter of not less than 1000 Å, it is difficult to develop colors. When pH is outside the range of 7 to 8, color development properties are liable to deteriorate.

In the present invention, the colorant is contained in an amount of 0.05 to 0.5% by weight based on the total weight of the photopolymerizable compound, photopolymerization initiator and colorant.

When the amount of the colorant is less than 0.05% by weight, it is difficult to color a three-dimensional object and hence, a three-dimensional object which gives a massive impression, is colorful and has light-shielding properties cannot be obtained. On the other hand, when the amount is more than 0.5% by weight, the curing speed of the resin composition at the time of optical shaping becomes slow, thereby reducing the optical shaping speed and productivity. In an extreme case, photo-curing is impeded and optical shaping becomes impossible. In addition, even when a three-dimensional object is obtained, the obtained three-dimensional object undergoes deterioration in mechanical properties, dimensional accuracy and dimensional stability, making it of no utility value.

The amount of the colorant is preferably 0.05 to 0.3% by weight, more preferably 0.1 to 0.2% by weight.

In the present invention, a photo-radical initiator or a photo-cationic polymerization initiator is advantageously used as the photopolymerization initiator as described above.

Preferred examples of the photo-radical initiator include 2,2-dimethoxy-2-phenylacetophenone, diethoxyacetophenone, acetophe.none, 3-methylacetophenone, 2-hydroxymethyl-1-phenylpropane-1-one, 4'-isopropyl-2-hydroxy-2-propiophenone, 2-hydroxy-2-methylpropiophenone, p-dimethylaminoacetophenone, p-t-butyldichloroacetophenone, p-t-butyltrichloro-acetophenone, p-azidobenzalacetophenone, 1-hydroxycyclohexylphenyl ketone, benzophenone, methyl o-benzoyl benzoate, Michler's ketone, 4,4'- bisdiethylaminobenzophenone, xanthone, fluorenone, benzaldehyde, anthraquinone, triphenylamine, carbazole and the like.

When a compound having a cationic polymerizable group such as an epoxy group as well as a radical polymerizable group is used as the photopolymerizable compound, a photo-cationic polymerization initiator may be used in conjunction with the above photo-radical polymerization initiator. In this case, the photo-cationic polymerization initiator is not limited to a particular kind and conventionally known ones can be used.

The amount of the photopolymerization initiator is 0.1 to 10% by weight, preferably 1 to 5% by weight based on the total weight of the photopolymerizable compound, photopolymerization initiator and colorant.

The photo-curable resin composition of the present invention may contain a leveling agent, surfactant, organic polymer modifier, organic plasticizer, and organic or inorganic filler.

The resin composition of the present invention is liquid at normal temperature, preferably at 25° C., Since it is liquid at normal temperature, the resin composition of the present invention can be advantageously used for optical stereolithography.

The liquid resin composition of the present invention preferably has a viscosity of 1 to 1,000 poise at 25° C.

A method of preparing the resin composition for three-dimensional object by optical stereolithography of the present invention and a method of mixing the same are not particularly limited. The resin composition for three-dimensional object by optical stereolithography of the present invention can be prepared and mixed in accordance with conventionally known methods. For example, a photopolymerizable compound is prepared according to a conventional method, a photo-curable resin composition is produced by adding a photopolymerizable compound thereto in a light-screened atmosphere, particularly in ultraviolet light-screened atmosphere, an resin composition for three-dimensional object by optical stereolithography is prepared by adding a colorant to the resin composition into a light-screened atmosphere, and the obtained resin composition for three-dimensional object by optical stereolithography is preserved, distributed and marketed while light is screened so as to not cause polymerization.

The resin composition for three-dimensional object by optical stereolithography of the present invention can be also produced by preparing a masterbatch containing a colorant in a high concentration and mixing it with a photopolymerizable compound and a photopolymerization initiator as required. This method using a masterbatch is particularly preferred to develop colors effectively.

When the resin composition for three-dimensional object by optical stereolithography of the present invention is put into a light-shielding container produced from polyethylene or the like and preserved at a temperature of 5 to 30° C., the physical properties and the like of the resin composition do not undergo deterioration even after about 36 to 48 months of preservation. When it is taken out from the container and optically shaped after such long-term preservation, a desired colored three-dimensional object which has excellent dimensional accuracy, dimensional stability, mechanical properties and light-shielding properties, gives a massive impression and is colorful can be produced at a high optical shaping speed and in a good productivity.

When optical stereolithography is carried out using the resin composition for three-dimensional object by optical stereolithography of the present invention, any conventional known optical stereolithography methods and apparatuses can be used.

That is, according to the present invention, there is provided a method of producing a three-dimensional object, which comprises irradiating the resin composition of the present invention in a mold with light to cure it thereby to form a three-dimensional object.

In the present invention, active energy beams generated from an Ar laser, He-Cd laser, xenon lamp, metal halide lamp, mercury lamp or fluorescent lamp are preferably used as optical energy for curing the resin. Out of these, laser beams are particularly preferred. When laser beams are used as active energy beams, shaping time can be shortened by increasing energy level and yet a colored three-dimensional object having high shaping accuracy can be obtained by utilizing the high convergence of laser beams.

Stated more specifically, the production method of the present invention is preferably a method comprising the steps of irradiating the liquid resin composition for three-dimensional object by optical stereolithography of the present invention with active energy beams selectively so as to form a cured layer having a desired pattern, supplying an uncured liquid composition to the top of the cured layer, irradiating it with active energy beams likewise to newly form a cured layer continuous to the above cured layer, and further repeating this lamination procedure to obtain a desired three-dimensional object in the end. The obtained three-dimensional object can be used directly or after post-curing by irradiation with light or post-curing by heating to further enhance the mechanical properties and shape stability thereof.

The structure, shape and size of the three-dimensional object are not particularly limited and may be determined according to application thereof. A typical application field of the optical stereolithography of the present invention is the production of models for verifying outer appearance designs in the course of design, models for checking the functionality of parts, base models for producing resin molds or metal molds for the fabricating casting molds and direct molds for producing mold prototypes. Stated more specifically, the optical stereolithography of the present invention can be used for the production of models and processing models for precision parts, electric and electronic parts, furniture, construction structures, auto parts, containers, castings, metal molds and mother dies, parts for optical products such as cameras, microscopes, telescopes, binoculars and optical measuring instruments that require light-shielding properties and main body cases. Various three-dimensional objects which have high dimensional accuracy, good dimensional stability and light-shielding properties, give a massive impression and are colorful can be produced.

The following examples are given to further illustrate the present invention. It is to be understood that the present invention is not limited to these examples. "Parts" in the following examples means parts by weight. In the following examples, the measurement of cure depth for investigating the relationship between exposure energy and irradiation for curing at the time of optical stereolithography, the evaluation of the light-shielding properties of a three-dimensional object obtained finally in each example, and the measurement of the tensile strength and elastic modulus in tension of a three-dimensional object (test sample) were carried out as follows.

Measurement of Cure Depth:

The measurement of cure depth was carried out based on a theory described in "Rapid Prototyping & Manufacturing, Fundamentals of Stereo-Lithography" written by Paul F. Jacobs, Society of Manufacturing Engineers, 1992. The amount of exposure was controlled by changing the drawing speed to produce 6 to 10 kinds of stepped cured products. Each of the cured product was taken out from an uncured solution with tweezers and the uncured resin was removed to measure the thickness of a layer cured by each of five different amounts of exposure with constant-pressure calipers.

Evaluation of Light-shielding Properties of Three-dimensional Object:

Using a spectrophotometer ("UV-210A" of Shimadzu Corp.), the absorbance of a three-dimensional object at a wavelength range of 400 to 550 nm in a thickness direction of the three-dimensional object was measured to evaluate the light-shielding properties of the three-dimensional object based on the absorbance.

Measurement of Tensile Strength and Elastic Modulus in Tension of Three-dimensional Object (test sample):

Measured in accordance with JIS K7113.

Referential Example 1 [preparation of urethane acrylate photo-curable resin composition prior to addition of colorant]

(1) 4,600 Parts of an addition product of bisphenol A with 4-mols of propylene glycol and 4,420 parts of isophorone diisocyanate were charged into a 20-liter four-necked flask equipped with a stirrer, temperature regulator, thermometer and condenser, and 2.6 parts of di-n-butyltin dilaurate was added to the flask at 40 to 50° C. to carry out a reaction at the same temperature for 30 minutes. Then, the reaction temperature was raised to 80 to 90° C. to continue the reaction for another 2 hours. Thereafter, 2,320 parts of 2-hydroxyethyl acrylate and 5.5 parts of hydroquinone monomethyl ether were added and a reaction was continued at the same temperature for another 2 hours to produce urethane acrylate oligomer having a bisphenol A diol skeleton.

(2) 1,320 Parts of the urethane acrylate oligomer obtained in (1) above, 1,080 parts of polyethylene glycol 200 diacrylate ("NK Ester A-200" of Shin Nakamura Chemical Co. Ltd.) and 480 parts of ethylene oxide-modified trimethylol propane triacrylate ("A-TMPT-3EO" of Shin Nakamura Chemical Co. Ltd.) were charged into a 5-liter container, the container was deaerated under reduced pressure and substituted with nitrogen, and the content was mixed under stirring at a temperature of 50° C. for about 1 hour.

(3) 120 Parts of 2,2-dimethoxy-2-phenylacetophenone ("Irgacure-651" of Ciba-Geigy Ltd: photo-radical polymerization initiator) was added to 2,880 parts of the mixture obtained in (2) above in an ultraviolet light-screened environment, and mixed under stirring at a temperature of 25° C. (mixing and stirring time: about 6 hours) until it was completely dissolved to prepare a liquid urethane acrylate photo-curable resin composition. This resin composition was preserved at 25° C. in an ultraviolet light-screened environment.

Referential Example 2 [preparation of epoxy photo-curable resin composition prior to addition of colorant]

(1) 4,000 Parts of 3,4-epoxycyclohexylmethyl-3,4-epoxycyclohexane carboxylate, 1,000 parts of 1,4-butanediol diglycidyl ether, 2,500 parts of 2,2-bis[4-(acryloxydiethoxy)phenylpropane] ("NK Ester A-BPE-4" of Shin Nakamura Chemical Co. Ltd) and 2,500 parts of ethylene oxide-modified trimethylolpropane triacrylate ("A-TMPT-3EO" of Shin Nakamura Chemical Co. Ltd) were charged to a 20-liter four-necked flask equipped with a stirrer, temperature regulator, thermometer and condenser and mixed under stirring at a temperature of 20 to 25° C. for about 1 hour.

(2) 60 Parts of 2,2-dimethoxy-2-phenylacetophenone ("Irgacure-65" of Ciba-Geigy Ltd: photo-radical polymerization initiator) and 45 parts of bis[4-(diphenylsulfonio)phenyl]sulfide bishexafluoroantimonate (photo-cationic polymerization initiator) were added to 3,000 parts of the mixture obtained in (1) above in an ultraviolet light-screened environment, and mixed under stirring at 25° C. until they were completely dissolved (mixing and stirring time: about 6 hours) to prepare an epoxy liquid photo-curable resin composition. This composition was preserved at 25° C. in an ultraviolet light-screened environment.

Experimental Example 1 [measurement for relationship between cure depth and exposure energy]

(1) 0.28 part of carbon black ("Carbon Black #5" of Mitsubishi Chemical Corporation) was added to 100 parts of the liquid urethane acrylate photo-curable resin composition obtained in the above Referential Example 1 and fully mixed under stirring at 25° C. for about 1 hour until a uniform liquid was obtained. Thus, a resin composition for three-dimensional object by optical stereolithography was produced.

(2) Using the resin composition for three-dimensional object by optical stereolithography containing carbon black obtained in (1) above and a very high-speed optical shaping system ("SOLIFORM300" of Teijin Seiki Co. Ltd) and irradiating water-cooled Ar laser beams (output of 400 mW; wavelength of 354,365 nm; beam diameter of 0.2 mm; liquid surface output of 175 mW) having energies of 25, 50, 75, 100 and 125 mJ/cm$^2$ shown in Table 1 below as exposure energy, optical shaping was carried out for an average shaping time of 2 minutes for each layer at a slice pitch (layer thickness) of 0.2 mm. When the cure depth on each of exposure energies was measured in accordance with the above method to investigate the relationship between cure depth and exposure energy, the following relationship shown in Table 1 below was found.

TABLE 1

| Exposure energy (mJ/cm$^2$) | Cure depth (cured thickness) ($\mu$m) |
| --- | --- |
| 25 | 180 |
| 50 | 480 |
| 75 | 600 |
| 100 | 700 |
| 125 | 800 |

It is understood from the results of the above Table 1 that the resin composition for three-dimensional object by optical stereolithography (the resin composition for three-dimensional object by optical stereolithography included in the scope of the present invention) of Experimental Example 1 which contains 0.28 part of carbon black based on 100 parts of a photo-curable resin composition (urethane acrylate photo-curable resin composition) can be photo-cured with a preferred cure depth by the irradiation of optical energy even when it contains carbon black.

Experimental Example 2 [measurement for relationship between cure depth and exposure energy]

(1) 0.28 part of the same carbon black as used in Experimental Example 1 was added to 100 parts of the liquid epoxy photo-curable resin composition obtained in Referential Example 2 and fully stirred at 25° C. for about 1 hour until a uniform liquid was obtained. Thus, a resin composition for three-dimensional object by optical stereolithography was produced.

(2) Using the resin composition for optical stereolithographed object containing carbon black obtained in (1) above, setting an air-cooled He/Cd laser beams (output of 100 mW; wavelength of 325 nm) of Kinmon Electric Corp. Ltd. in a very high-speed optical shaping system ("SOLIFORM-500" of Teijin Seiki Co. Ltd), and irradiating with beams of energies of 45, 68, 112, 157 and 201 mJ/cm$^2$ shown in Table 2 below as exposure energy, optical shaping was carried out for an average shaping time of 3 minutes for each layer at a slice pitch (layer thickness) of 0.10 mm. When the cure depth on each of the exposure energies was measured in accordance with the above method to investigate the relationship between cure depth and exposure energy, the following relationship shown in Table 2 below was found.

TABLE 2

| Exposure energy (mJ/cm$^2$) | Cure depth (cured thickness) ($\mu$m) |
| --- | --- |
| 45 | 82 |
| 68 | 131 |
| 112 | 194 |
| 157 | 235 |
| 201 | 266 |

It is understood from the results of the above Table 2 that that the resin composition for three-dimensional object by optical stereolithography (resin composition for three-dimensional object by optical stereolithography included in the scope of the present invention) of Experimental Example 2 which contains 0.28 part of carbon black based on 100 parts of a photo-curable resin composition (liquid epoxy photo-curable resin composition) can be photo-cured with a preferred cure depth by the irradiation of optical energy even when it contains carbon black.

EXAMPLE 1

(1) 0.28 part of the same carbon black as used in Experimental Example 1 was added to 100 parts of the liquid urethane acrylate photo-curable resin composition obtained in Referential Example 1 and fully stirred at 25° C. for about 1 hour until a uniform liquid was obtained. Thus, a resin composition for three-dimensional object by optical stereolithography was produced.

(2) Using the resin composition for three-dimensional object by optical stereolithography containing carbon black obtained in (1) above and the same very high-speed optical shaping system as used in (2) of Experimental Example 1 and irradiating with water-cooled Ar laser beam (output of 400 mW; wavelength of 354.365 nm) having an exposure energy of 50 mJ/cm$^2$, a stereolithographed object [maximum size of X axis×Y axis×Z axis (thickness)=50.0 mm×50.0 mm×0.7 mm] was produced. This three-dimensional object (cured product) was taken out from the above optical shaping system, an uncured product adhered to the three-dimensional object was removed by washing with isopropyl alcohol, and the three-dimensional object was post-cured for 10 minutes using a 3KW ultraviolet lamp. The obtained three-dimensional object was measured for its light-shielding properties in the thickness direction in accordance with the above-described method and the results shown in Table 3 below were obtained.

(3) A three-dimensional object (cured product) corresponding to a dumbbell test sample [maximum size of X axis×Y axis×Z axis=20.0 mm×175.0 mm×4.0 mm] based on JIS K7113 was produced in the same manner as in (2) above using the resin composition for three-dimensional object by optical stereolithography containing carbon black obtained in (1) above. The obtained three-dimensional object (test sample; cured product) was taken out from the above optical shaping system, an uncured product adhered to the three-dimensional object was removed by washing with isopropyl alcohol, and the three-dimensional object was post-cured for 10 minutes using a 3KW ultraviolet lamp. The obtained three-dimensional object (test sample) was measured for its tensile strength and elastic modulus in tension in accordance with the above-described method and the results shown in Table 3 below were obtained.

EXAMPLE 2

(1) 0.21 part of the same carbon black as used in Experimental Example 1 was added to 100 parts of the liquid urethane acrylate photo-curable resin composition obtained in Referential Example 1 and fully stirred at 25° C. for about 1 hour until a uniform liquid was obtained. Thus, a resin composition for three-dimensional object by optical stereolithography was produced.

(2) Using the resin composition for three-dimensional object by optical stereolithography containing carbon black obtained in (1) above, a three-dimensional object was optically shaped in the same manner as in (2) of Example 1 and post-cured. The three-dimensional object after post-curing was measured for its light-shielding properties in the thickness direction and the results shown in Table 3 below were obtained.

(3) Using the resin composition for three-dimensional object by optical stereolithography containing carbon black obtained in (1) above, a dumbbell test sample (three-dimensional object) was produced in the same manner as in (3) of Example 1 and post-cured. The three-dimensional object (test sample) after post-curing was measured for its tensile strength and elastic modulus in tension in accordance with the above-described methods and the results shown in Table 3 below were obtained.

EXAMPLE 3

(1) 0.28 part of the same carbon black as used in Experimental Example 1 was added to 100 parts of the liquid epoxy photo-curable resin composition obtained in Referential Example 2 and fully stirred at 25° C. for about 1 hour until a uniform liquid was obtained. Thus, a resin composition for three-dimensional object by optical stereolithography was produced.

(2) Using the resin composition for three-dimensional object by optical stereolithography containing carbon black obtained in (1) above, a three-dimensional object was optically shaped in the same manner as in (2) of Example 1 and post-cured. The three-dimensional object after post-curing was measured for its light-shielding properties in the thickness direction and the results shown in Table 3 below were obtained.

(3) Using the resin composition for three-dimensional object by optical stereolithography containing carbon black obtained in (1) above, a dumbbell test sample (three-dimensional object) was produced in the same manner as in (3) of Example 1 and post-cured. The three-dimensional object (test sample) after post-curing was measured for its tensile strength and elastic modulus in tension in accordance with the above-described methods and the results shown in Table 3 below were obtained.

COMPARATIVE EXAMPLE 1

(1) 0.02 part of the same carbon black as used in Experimental Example 1 was added to 100 parts of the liquid urethane acrylate photo-curable resin composition obtained in Referential Example 1 and fully stirred at 25° C. for about 1 hour until a uniform liquid was obtained. Thus, a resin composition for three-dimensional object by optical stereolithography was produced.

(2) Using the resin composition for three-dimensional object by optical stereolithography containing carbon black obtained in (1) above, a three-dimensional object was optically shaped in the same manner as in (2) of Example 1 and post-cured. The three-dimensional object after post-curing was measured for its light-shielding properties in the thickness direction and the results shown in Table 3 below were obtained.

(3) Using the resin composition for three-dimensional object by optical stereolithography containing carbon black obtained in (1) above, a dumbbell test sample (three-dimensional object) was produced in the same manner as in (3) of Example 1 and post-cured. The three-dimensional object (test sample) after post-curing was measured for its tensile strength and elastic modulus in tension in accordance with the above-described methods and the results shown in Table 3 below were obtained.

COMPARATIVE EXAMPLE 2

(1) 0.70 part of the same carbon black as used in Experimental Example 1 was added to 100 parts of the liquid urethane acrylate photo-curable resin composition obtained in Referential Example 1 and fully stirred at 25° C. for about 1 hour until a uniform liquid was obtained. Thus, a resin composition for three-dimensional object by optical stereolithography was produced.

(2) When an attempt was made to carry out optical shaping using the resin composition for three-dimensional object by optical stereolithography containing carbon black obtained in (1) above in the same manner as in (2) of Example 1, the composition was not photo-cured and stereolithography was impossible to conduct.

(3) When an attempt was made to produce a dumbbell test sample (three-dimensional object) using the optical 3-D forming resin composition containing carbon black obtained in (1) above in the same manner as in (3) of Example 1, the composition was not photo-cured and stereolithography was impossible to conduct, as shown in Table 3 below.

TABLE 3

| | | | Physical properties of three-dimensional object | | |
|---|---|---|---|---|---|
| | Kind of Composition 1) | Amount of carbon black 2) (parts) | Light-shielding properties (absorbance) | Tensile strength (kg/mm²) | Elastic modulus in tension (kg/mm²) |
| Ex. 1 | A | 0.28 | ≧95% | 4.5 | 190 |
| Ex. 2 | A | 0.21 | ≧85% | 4.8 | 201 |
| Ex. 3 | B | 0.28 | ≧95% | 5.3 | 235 |
| Comp. Ex. 1 | A | 0.02 | ≧10% | 4.2 | 192 |
| Comp. Ex. 2 | A | 0.70 | Not photo-cured and stereolithography impossible | | |

Ex: Example, Comp. Ex.: Comparative Example

1) Kind of photo-curable resin composition
   A: urethane acrylate liquid photo-curable resin composition obtained in Referential Example 1
   B: epoxy liquid photo-curable resin composition obtained in Referential Example 2

2) Amount of carbon black added is based on 100 parts of liquid photo-curable resin composition It is understood from the results of the above Table 3 that when optical shaping is carried out using the resin compositions for three-dimensional object by optical stereolithography of Examples 1 to 3 containing carbon black in an amount ranging from 0.05 to 0.5 parts by weight based on 100 parts by weight of the photo-curable resin composition, three-dimensional objects having excellent light-shielding properties with high absorbance (low light transmission) and excellent mechanical properties can be obtained smoothly at a high optical shaping speed.

In contrast, when the resin compositions for three-dimensional object by optical stereolithography of Comparative Example 1 containing 0.02 part by weight of carbon black based on 100 parts by weight of the photo-curable resin composition, which is below the lower limit (0.05% by weight) of the present invention, is used, optical shaping can be carried out smoothly but a three-dimensional object having light-shielding properties cannot be obtained.

When the resin compositions for three-dimensional object by optical stereolithography of Comparative Example 2 containing 0.70 part by weight of carbon black based on 100 parts by weight of the photo-curable resin composition, which is above the upper limit (0.5% by weight) of the present invention, is used, photo-curing does not take place at a normal optical shaping speed and a three-dimensional object cannot be produced.

EXAMPLE 4

1,425 Parts of urethane acrylate obtained in Referential Example 1 and 75 parts of carbon black (#5 of Mitsubishi Chemical Corporation) were charged into a porcelain ball mill and kneaded for 480 hours to obtain a masterbatch. A composition having the same composition as the compositions of Examples 1 and 2 was prepared using this masterbatch. The physical properties of the obtained three-dimensional object were almost the same as those of Examples 1 and 2.

When optical stereolithography is carried out using the resin composition for three-dimensional object by optical stereolithography of the present invention, a colored optical three-dimensional object which has excellent mechanical and physical properties such as dimensional accuracy, shape stability, tensile strength and elastic modulus in tension as well as light-shielding properties, gives a massive impression and is colorful can be produced at a high optical shaping speed and in a good productivity.

The colored three-dimensional object by optical stereolithography obtained by the present invention can be used effectively for a wider range of application than before, utilizing the above excellent properties such as massive impression, colorfulness and light-shielding properties.

What is claimed is:

1. A method for producing a three-dimensional object by optical stereolithography which comprises irradiating a resin composition which has been poured in a mold having a desired three-dimensional shape to thereby cure the composition in the shape of the mold, said composition being liquid at ambient temperature and comprising a photopolymerizable compound, a photopolymerization initiator present in an amount of 0.1 to 10% by weight of the composition and a colorant comprising carbon black having an average particle diameter of 200 to 1000 Å and a pH of 7 to 8, said colorant being present in an amount of 0.05 to 0.5% by weight, based on the weight of the composition.

2. The method of claim 1 wherein the photopolymerizable compound is at least one member selected from the group consisting of acrylate compounds, urethane acrylate compounds, epoxy compounds, epoxy acrylate compounds and vinyl ether compounds.

3. The method of claim 1 wherein the photopolymerization initiator is at least one member selected from the group consisting of photo-radical polymerization initiators and photo-cationic polymerization initiators.

* * * * *